United States Patent [19]

Matsuo

[11] Patent Number: 5,686,749
[45] Date of Patent: Nov. 11, 1997

[54] NON-VOLATILE SEMICONDUCTOR MEMORY DEVICE WITH THIN FILM TRANSISTOR FORMED ON A SEPARATION INSULATING FILM ADJACENT TO A MEMORY CELL, AND METHOD OF MAKING THEREOF

[75] Inventor: Makoto Matsuo, Tokyo, Japan

[73] Assignee: NEC Corporation, Tokyo, Japan

[21] Appl. No.: 534,648

[22] Filed: Sep. 27, 1995

[30] Foreign Application Priority Data

Sep. 29, 1994 [JP] Japan .................. 6-235150

[51] Int. Cl.⁶ .................. H01L 29/788
[52] U.S. Cl. .................. 257/316; 257/326
[58] Field of Search .................. 257/314, 315, 257/319, 320, 321, 326

[56] References Cited

U.S. PATENT DOCUMENTS 5,267,195  11/1993  Kodama .................. 357/314
5,321,286  6/1994   Koyama et al. .................. 257/315
5,493,139  2/1996   Akiyama et al. .................. 257/316

FOREIGN PATENT DOCUMENTS 0097976  5/1986  Japan .................. 257/315
0021478  1/1994  Japan .................. 257/315

*Primary Examiner*—Tom Thomas
*Assistant Examiner*—David B. Hardy
*Attorney, Agent, or Firm*—Sughrue,Mion,Zinn,Macpeak & Seas, PLLC

[57] ABSTRACT

In a non-volatile semiconductor memory device, predetermined number of memory cells each comprising a non-volatile semiconductor memory element of a floating gate type transistor are connected to a first bit line in parallel, and the first bit line is connected to one of the source and drain regions of each thin film transistor while the other of the source and drain regions is connected to a second bit line. The thin film transistor and the floating gate electrode of the floating gate type transistor are formed in the same semiconductor thin film. The thin film transistor is a selection transistor for selectively reading out data stored in said memory cells, and is a sector erasing transistor for selectively erasing data stored in the memory cells.

19 Claims, 5 Drawing Sheets

NON-VOLATILE SEMICONDUCTOR MEMORY DEVICE WITH THIN FILM TRANSISTOR FORMED ON A SEPARATION INSULATING FILM ADJACENT TO A MEMORY CELL, AND METHOD OF MAKING THEREOF

BACKGROUND OF THE INVENTION

1. Field of the Invention

The present invention relates to a semiconductor memory device, and particularly to a non-volatile semiconductor memory device using EEPROM type memory devices as memory cells.

2. Description of Related Art

Various types of semiconductor memory devices have been hitherto developed and manufactured, and in these semiconductor devices, much attention is now being paid particularly to a flash EEPROM for the following reason. That is, in the flash EEPROM, a memory cell can be constructed by one floating gate-type transistor, so that semiconductor devices can be easily designed in high density and thus high integration of a memory device can be easily performed. However, the non-volatile memory devices as described above need a higher operating voltage than that of other memory devices, for example, volatile memory devices such as DRAMs, SRAMs, etc., and this is unavoidable because it is an inherent characteristic to the floating-gate type transistor.

The floating-gate transistor has a double-layered gate electrode structure in which a first layer gate electrode is formed on a silicon oxide film of the principal plane of a semiconductor substrate, and a composite layer insulating film which is composed of a silicon oxide film and a silicon nitride film is formed on the upper portion of the first layer gate electrode. Further, a second gate electrode serving as a control gate electrode is formed on the upper portion of the layer insulating film. In this structure, non-volatile memory information charges are stored in the first gate electrode serving as the floating gate electrode. Therefore, the writing and erasing operations of the information charges are performed by injecting electrons from the semiconductor substrate into the floating gate electrode and discharging electrons from the floating gate electrode to the semiconductor substrate, respectively. In order to perform the writing and erasing operations as described above, a high electric field must be applied to the silicon oxide film as described above, and this causes the flash EEPROM to need a high operating voltage as described above.

It is a present tendency to need low power consumption or low-voltage power source for flash EEPROMs. In order to satisfy this need, there are utilized a method of performing the electron injection and the electron discharge as described above with FN (Fowler-Nordheim) current which flows through the silicon oxide film by an electron tunnel effect, and also a method of increasing an internal voltage with an internal boosting voltage circuit. In order to effectively utilize the internal boosting voltage circuit, a memory cell array is required to be suitably segmented into plural parts as shown in FIG. 1.

Next, the segmentation of the memory cell array will be discussed hereunder with reference to FIG. 1, however, the internal boosting voltage circuit is not drawing to simply the discussion of FIG. 1. In addition, the structure and arrangement of transistors when the memory cell array is segmented will be described with reference to FIGS. 2A and 2B.

FIG. 1 is a circuit diagram showing a memory cell unit of a flash EEPROM. FIG. 2A is a cross-sectional view showing the memory cell unit shown in FIG. 1, which is taken along a line A–B of FIG. 2B, and FIG. 2B is a plan view showing the arrangement of the memory cell unit and particularly it shows diffusion layers and gate electrodes of transistors of the memory cell unit to simplify the illustration of the memory cell unit.

The memory cell unit is designed so that memory cell transistors $M_{11}, M_{21}, \ldots, M_{n1}, M_{12}, M_{22}, \ldots, M_{n2}$ each of which is formed such as a floating-gate type transistor of a non-volatile memory element are arranged as shown in FIG. 1. The drain area of each transistor is connected to an auxiliary bit S1 (S2), and further connected through a selection transistor $W_{11}$ ($W_{12}$) to a main bit line M1 (M2) at a node N1 (N2). Selection transistors $W_{21}$ and $W_{22}$ are used for another memory cell block. Furthermore, the source area of each memory cell transistor is connected to an erasing bit line K1, and further connected to a sector erasing transistor $S_{11}$.

The control gate electrodes of the respective transistors as described above are connected to the following wires. That is, the control gate electrodes of the memory cell transistors are connected to word lines $W_1, W_2, \ldots, W_n$, the gate electrodes of the selection transistors are connected to selection word lines $WS_1$ and $WS_2$, and the gate electrode of the sector erasing transistor $S_{11}$ is connected to an erasing word line WSS. The segmentation of the memory cell array of the non-volatile semiconductor memory device is performed as described above.

Next, the structure of the selection transistors and the memory cell transistors in the memory cell unit will be described with reference to FIGS. 2A and 2B.

Diffusion layers 102 and 102a which will be source and drain regions of each selection transistor respectively are formed on the surface of a silicon substrate 101 as shown in FIG. 2A. Thereafter, a gate insulation film 103 for the selection transistor is formed on the principal plane of the semiconductor substrate 101, and a gate electrode 104 for the selection transistor is formed on the gate insulating film 103. The diffusion layer 102 for the selection transistor is connected to the main bit line 107 through a contact hole which is formed in a first layer insulating film 105 and a second layer insulating film 106.

Furthermore, diffusion layers 108 and 108a for the memory cell transistor are formed on the memory cell unit, and these layers will serve as source and drain regions of the memory cell transistor. Thereafter, a first gate insulating film 109, a floating gate electrode 110, a second gate insulating film 111 and a control gate electrode 112 of the memory cell transistor are formed to complete a memory cell transistor which is a non-volatile memory element. After this process, the diffusion layer 108 for the memory cell transistor is connected to the auxiliary bit line 113 through a contact hole which is formed in a first layer insulating film 105. With this connection, the diffusion layer 108 for the memory cell transistor is electrically connected to the diffusion layer 102a for the selection transistor.

As described above, a high voltage is applied across the source and drain regions of the selection transistor or the memory cell transistor, and also applied to the gate electrode of the selection transistor. Therefore, the diffusion layers 102 and 102a for the selection transistor and the diffusion layers 108 and 108a for the memory cell transistor are formed in such a depth that each diffusion layer has an impurity-concentration gradient. In addition, the gate insulating film 103 for the selection transistor is formed to be thick.

The gate electrodes 104 of the selection transistors thus formed are connected to one other so as to match the connection arrangement of the selection word lines $WS_1$, $WS_2$, etc., and the control gate electrodes 112 of the memory cell transistors are connected to one another so as to match the connection arrangement of the word lines $W_1$, $W_2$, ..., $W_n$, etc. Furthermore, the main bit line 107 and the auxiliary bit line 113 are arranged so as to match the main bit lines M1, M2 and the auxiliary lines S1,S2 respectively.

As described above, in the conventional memory cell unit, each selection transistor is formed of an MIS type FET on the semiconductor substrate, and this structure of the selection transistor limits the arrangement pitch of the memory cells in a word line direction to the arrangement pitch of the selection transistors as follows.

When a high voltage in a write-in operation of information into a memory cell is applied to the diffusion layer 108 for the memory cell transistor, a high voltage is also applied to each of the diffusion layer 102 for the selection transistor and the gate electrode 104 of the selection transistor. In this case, it is required to perfectly shield a parasitic MOS transistor which is formed between neighboring selection transistors as shown in FIG. 2B. That is, the interval $L_0$ between the diffusion layer 102 of a selection transistor and the diffusion layer 102b of its neighboring selection transistor must be set to such a large value that the parasitic MOS transistor is prevented from operating under application of a high voltage.

As described above, in the conventional method of forming the selection transistor, the arrangement pitch of the memory cells in the word line direction is limited to a permissible interval at which each of the neighboring selection transistors operates normally under application of a high voltage without actuating a parasitic MOS transistor therebetween, so that it is difficult to achieve high integration of the non-volatile memory device.

A technique for high integration of a non-volatile memory device is disclosed in U.S. Pat. No. 5,267,195 (by N. Kodama). This patent discloses a technique of forming a layer insulating film on a gate electrode on a floating gate of a memory cell, and further forming a thin film transistor on the layer insulating film for high integration. However, according to the non-volatile semiconductor memory device as described above, the manufacturing process becomes more complicated.

SUMMARY OF THE INVENTION

An object of the present invention is to provide a non-volatile semiconductor memory device which can progress the fining of the structure (microstructure) of memory cells or remove limitation on high-integration structure of memory cells, and thus can be highly integrated in structure, and which is usable with low power consumption.

In order to attain the above object, a non-volatile semiconductor memory device according to one aspect of the present invention includes memory cells each of which comprises a floating gate type transistor having a floating gate electrode formed through a first gate insulating film on the principal plane of a semiconductor substrate and a control gate electrode formed through a second gate insulating film on the floating gate electrode, wherein a predetermined number of memory cells is connected to a first bit line in parallel, and the first bit line is connected to one of source and drain regions of each thin film transistor while the other of the source and drain regions is connected to a second bit line.

Furthermore, the thin film transistor is formed on a element separation insulating film which is provided on the surface of the semiconductor substrate, and a gate insulating film of the thin film transistor is constructed by the second gate insulating film.

And, a method of manufacturing the above-mentioned non-volatile semiconductor memory device according to another aspect of the present invention comprises the steps of forming a first gate insulating film on the principal plane of the semiconductor substrate in which a element separation insulating film is selectively provided, forming a silicon thin film so as to cover the first gate insulting film, forming a second gate insulating film on the silicon thin film, and forming a thin metal film so as to cover the second gate insulating film, wherein source and drain regions and a channel region of the thin film transistor and the floating gate electrode are formed in the silicon thin film, and the gate electrode of the thin film transistor and the control gate electrode are formed in the metal thin film.

DETAILED DESCRIPTION OF THE PREFERRED EMBODIMENT

A preferred embodiment according to the present invention will be described hereunder with reference to the accompanying drawings.

Figure 3A:
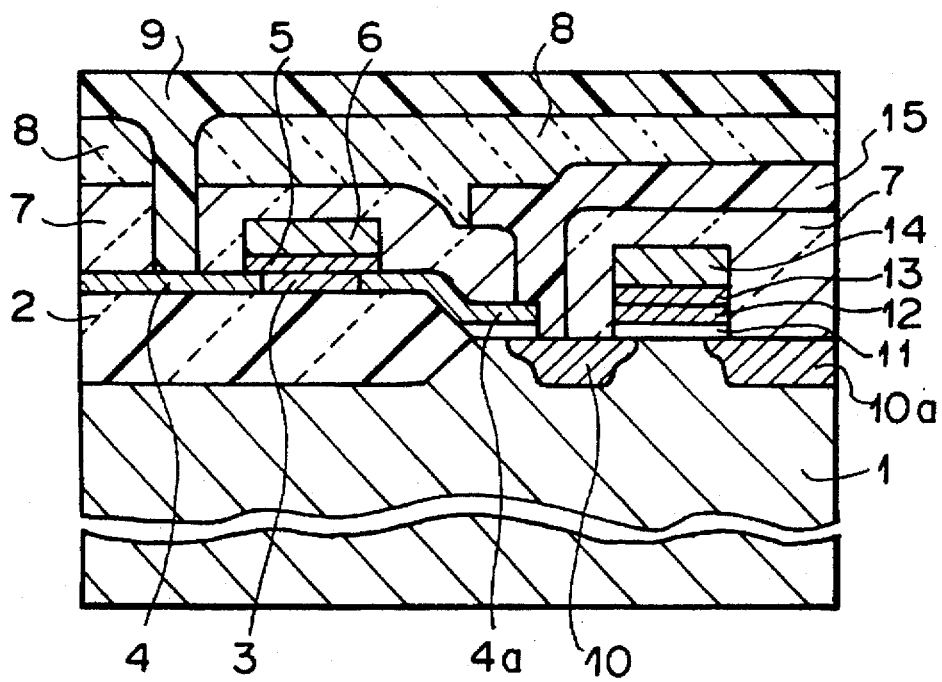
FIGS. 3A and 3B are cross-sectional view and plan view showing a memory cell unit according to an embodiment of the present invention.
Figure 3B:
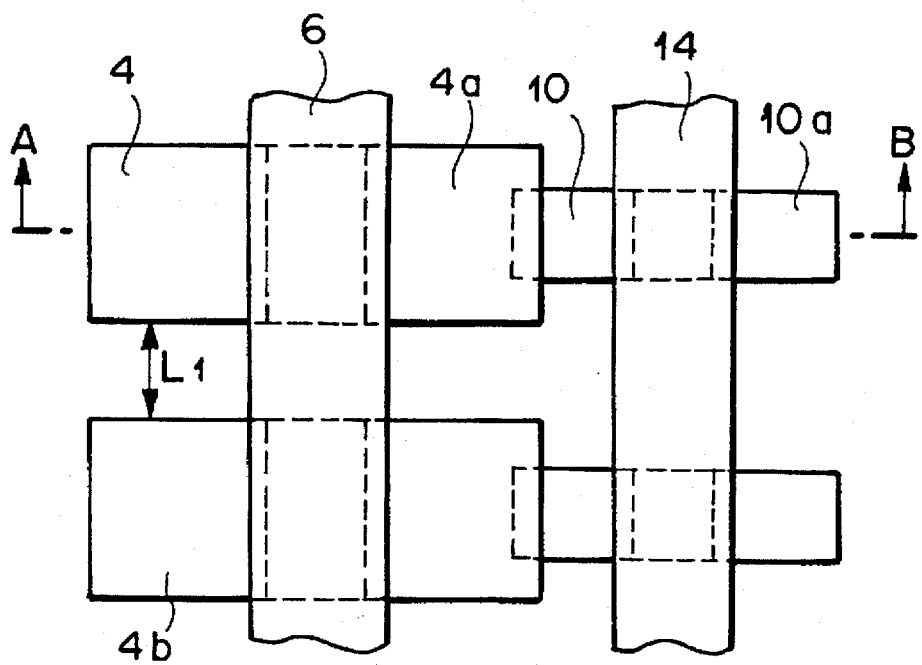

FIGS. 3A and 3B are a cross-sectional view and plan view showing a non-volatile semiconductor memory device according to an embodiment of the present invention. FIG. 3A is a cross-sectional view which is taken along a line A–B of FIG. 3B. FIG. 3B shows the diffusion layers and the gate electrodes of selection transistors and memory cell transistors as described above to simplify the illustration. The arrangement of the memory cells of this embodiment is substantially identical to that shown in FIG. 1.

As shown in FIG. 3A, selection transistors are formed on a element separation insulating film 2 which is formed on the surface of a silicon substrate 1, and memory cell transistors are formed on the principal plane of the silicon substrate 1. The element separation insulating film 2 is formed of a thick silicon oxide film. Furthermore, a silicon thin film 3 is formed on the element separation insulating film 2, and diffusion layers 4 and 4a for selection transistors (hereinafter referred to as "ST diffusion layers") which will be the source and drain regions of the selection transistors are formed on the silicon thin film 3. Further, a gate insulating film 5 for the selection transistors (hereinafter referred to as "ST gate insulating film") is formed on the surface of the silicon thin film 3 as described above, and then a gate electrode 6 for the selection transistors (hereinafter referred to as "ST gate electrode") is formed on the ST gate insulating film 5. As described above, the selection transistors are formed of thin film transistors. Further, the ST diffusion layer 4 which is formed on the element separation insulating film 2 as described above is connected to a main bit line through a contact hole which is formed in a first layer insulating film 7 and in a second layer insulating film 8.

On the other hand, diffusion layers 10 and 10a of the memory cell transistors (hereinafter referred to as "MCT diffusion layers") in the memory cell unit are formed on the surface of the silicon substrate 1, and they will be the source and drain regions of the memory cell transistors. Thereafter, a first gate insulating film 11, a floating gate electrode 12, a second gate insulating film 13 and a control gate electrode 14 of each memory cell transistor are formed to complete the memory cell transistor which is a non-volatile memory element. Thereafter, the MCT diffusion layer 10 and the ST diffusion layer 4a are connected to an auxiliary bit line 15 through a common contact hole which is formed in the first layer insulating film 7 as shown in FIG. 3A.

As described above, the selection transistors having the source and drain regions and the gate electrode to which a high voltage is applied are formed of thin film transistors on the silicon thin film, and the memory cell transistors are formed of floating gate type transistors to complete the basic construction of the non-volatile semiconductor memory device of the present invention.

As described above, the selection transistor to which a high voltage is applied is constructed by the thin film transistor provided on the element separation insulating film 2, whereby the integration degree can be greatly improved.

As shown in FIG. 3B, the active region of each selection transistor is formed of the silicon film, and its region is formed every selection transistor by a patterning process. Therefore, the neighboring selection transistors are perfectly insulated and separated from each other through the element separation insulating film 2 and the first layer insulating film 7. Accordingly, the operation of a parasitic MOS transistor which is caused between neighboring selection transistors and causes a critical problem in the prior art can be perfectly avoided. Therefore, according to the present invention, it is possible to reduce the interval L1 between the diffusion layers 4 and 4b of neighboring selection transistors to the permissible smallest value for the lithography technique.

Accordingly, reduction of memory cells in the word line direction can be facilitated, and the integration degree is estimated to be improved by about 20% as compared with the prior art. This value is greatly dependent on the design criteria of circuits or devices.

Furthermore, when the selection transistor is formed in a silicon thin film, the gap between the drain and source regions of the selection transistor can be easily formed to narrow. This will be described in detail with reference to FIG. 4.

Figure 4:
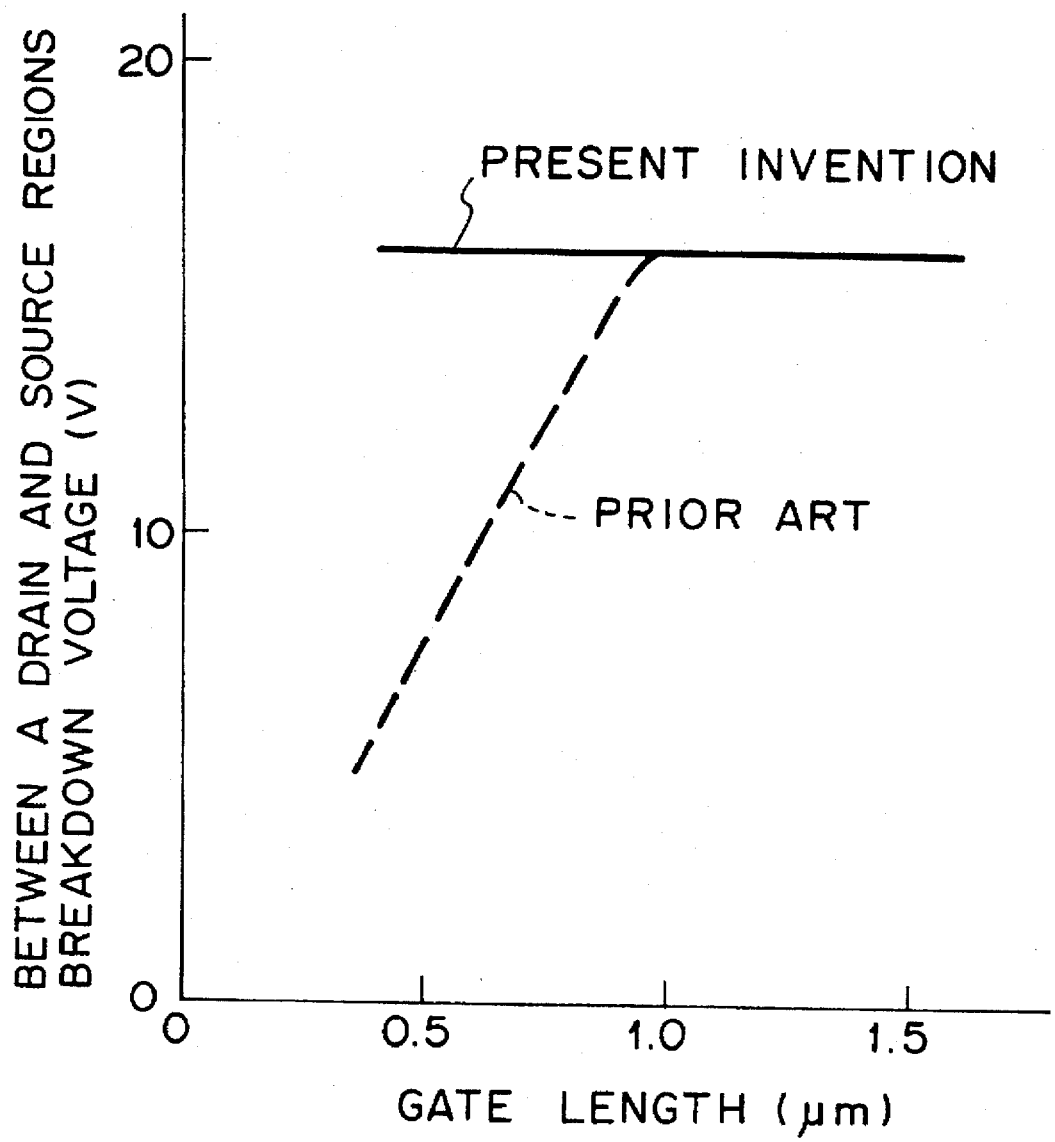
FIG. 4 is a diagram showing a characteristic of a breakdown voltage of a transistor used in the embodiment.

FIG. 4 is a graph showing the comparison of a breakdown voltage between the drain and source regions of the transistor when an MOS transistor is formed in a silicon thin film (the present invention) and when the MOS transistor is formed in a silicon substrate (prior art). In this case, the thickness of the gate insulating film which is formed of a silicon oxide film is set to 28 nm because a high voltage is applied thereto. Furthermore, the maximum breakdown voltage is dependent on the doping amount of the source and drain regions, and thus the graph of FIG. 4 shows an example of the breakdown-voltage characteristic.

In the conventional case, when the gate length of the transistor is below 1 µm, the breakdown voltage between the drain and source regions is rapidly reduced. Accordingly, the permissible gate length must be set to about 1.2 µm. On the other hand, in the present invention, no reduction of the breakdown voltage between the drain and source regions occurs until the gate length reaches about 0.5 µm. That is, the permissible gate length of the present invention may be set to about 0.5 µm. The gate length of the present invention is not limited to this value because this value is obtained for only the above case and it is dependent on the way the device is designed. At any rate, the gate length in the present invention can be reduced to a smaller value than that in the prior art, and the interval between the drain and source regions can be more reduced.

Figure 1:
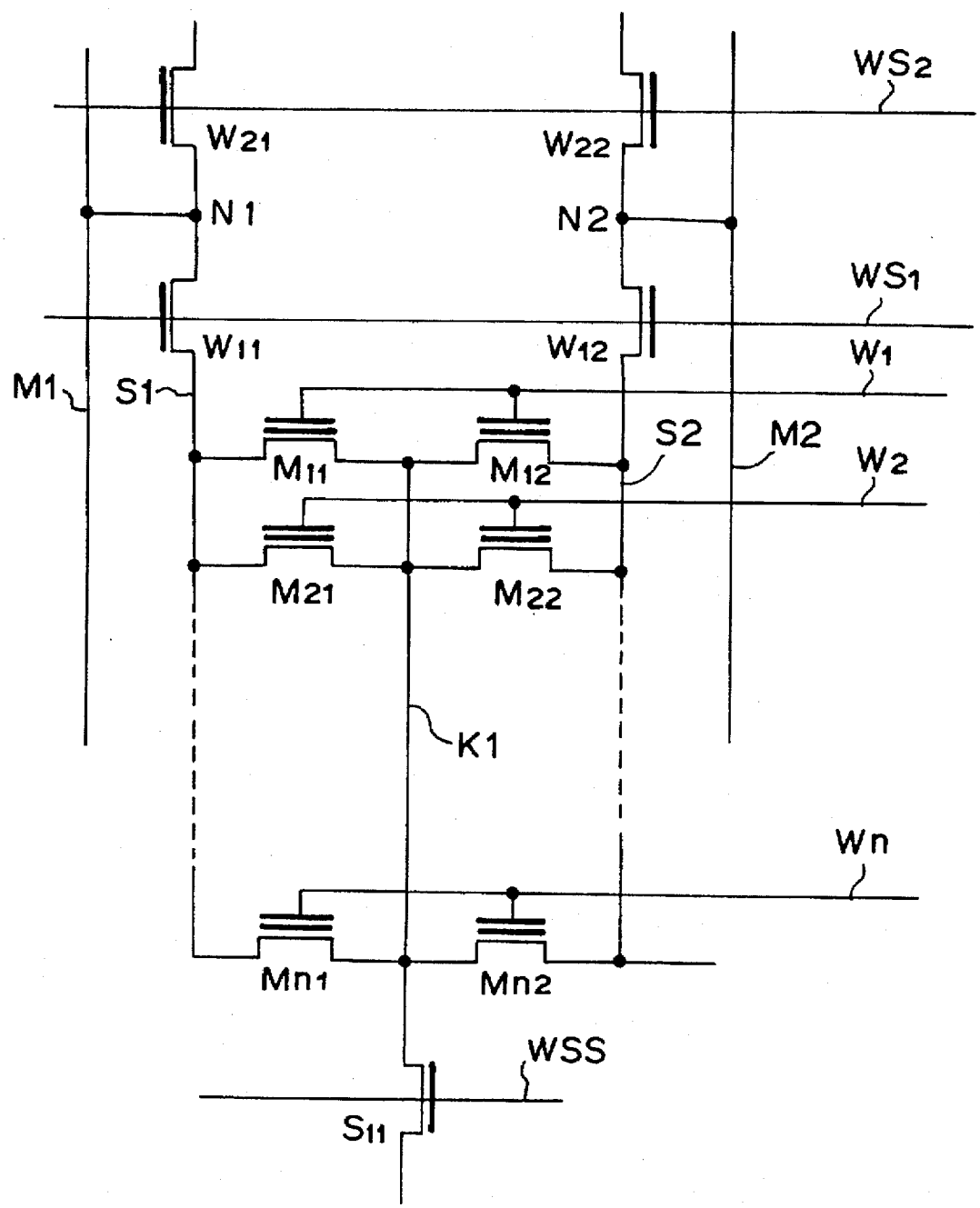
FIG. 1 is a circuit diagram showing a memory cell unit to which the present invention is applied.
Figure 2A:
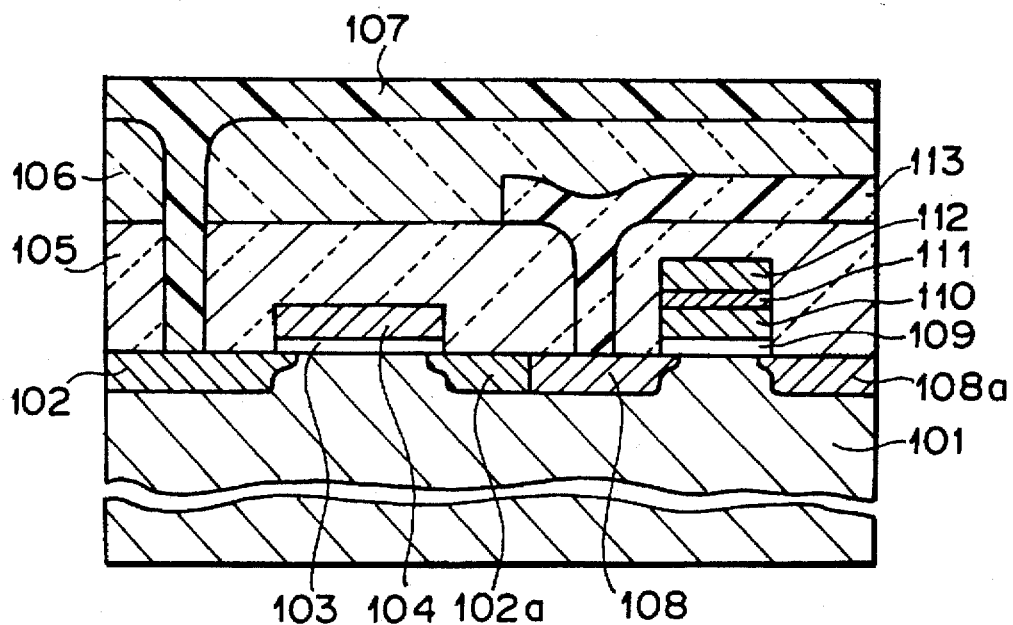
FIGS. 2A and 2B are cross-sectional view and plan showing a conventional memory cell unit.
Figure 2B:
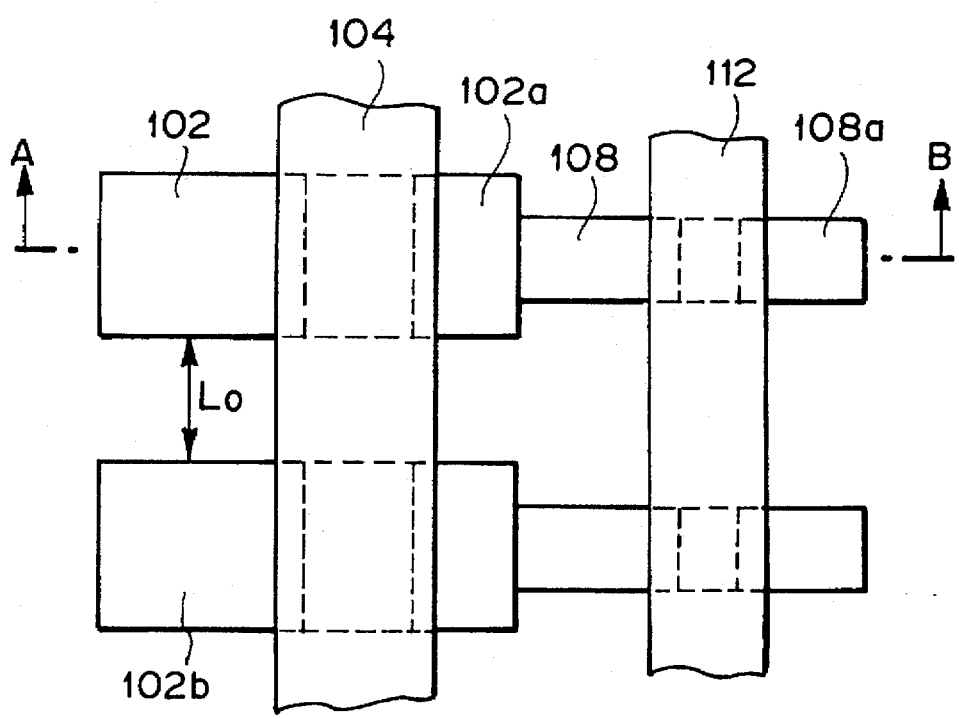

Here, writing, erasing and reading operations of the non-volatile semiconductor memory device according to the present invention will be briefly described with reference to FIG. 1.

The writing (storing) operation of the memory cell is performed as follows. The drain diffusion layer 4 for the selection transistors W11, W12, . . . , is set to a high potential (for example, 20V is applied thereto), and a voltage of 5 V, for example, is applied the selection gate 6 to set the selection transistors W11, W12, . . . to ON-state. Subsequently, the control gates W1, W2 . . . of the memory transistors M11, M22, . . . , are grounded to keep the source diffusion layer 4a in a floating potential state, and for example a high voltage of about 20V is applied to the drain diffusion layer 10 of the memory transistors M11, M12, . . . , whereby electrons are discharged from the floating gate 12 through a tunnel insulating film 11 by the Fowler-Nordheim tunneling effect.

Next, the erasing operation of the non-volatile semiconductor memory device is performed as follows.

The selection gate 6 of the selection transistors W11, W12, . . . are set to a high potential, for example, it is supplied with 20V, and the source diffusion layer 10a of the memory transistors M11, M12, . . . , the drain diffusion layer 4 of the selection transistors W11, W12, . . . , and the semiconductor substrate 1 are grounded to dope electrons from the drain diffusion layer 10 for the memory transistors M11, M12, . . . through the tunnel insulating film 11 into the floating gate 12 by the Fowler-Nordheim tunneling effect.

Furthermore, the reading operation of the non-volatile semiconductor memory device is performed as follows.

A voltage of 5V, for example, is applied to the control gate 14 of the memory transistors M11, M12, . . . , the source diffusion layer 10a of the memory transistors M11, M12, . . . is grounded, and a voltage of about 1V is applied to the drain diffusion layer 4 of the selection transistors W11, W12, . . . , to judge whether current flows, thereby judging a write-in status of the memory transistors M11, M22, . . .

In the above embodiment, the selection transistor is formed on the silicon thin film. However, the same effect can be obtained when a sector erasing transistor as described in the item of "DESCRIPTION OF RELATED ART" is formed on a silicon thin film.

Next, a method of manufacturing the non-volatile semiconductor memory device according to the present invention will be described with reference to FIGS. 5A to 5D.

Figure 5A:
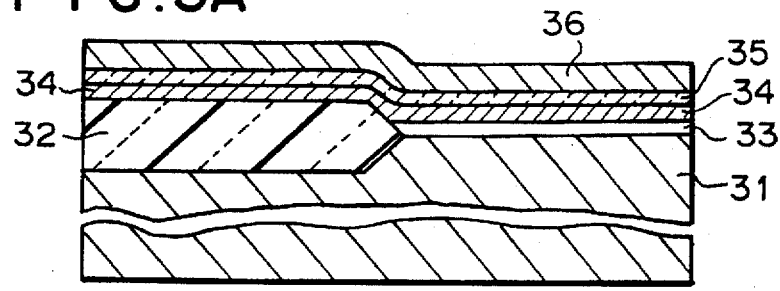
FIGS. 5A to 5D are cross-sectional views showing a series of processes to manufacture the memory cell unit of the embodiment.
Figure 5B:
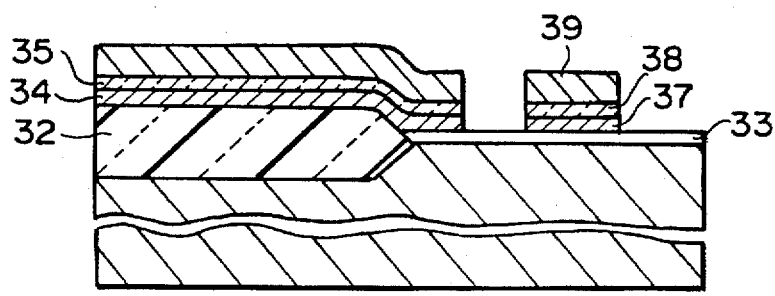

A element separation insulating film 32 which is composed of a thick silicon oxide film is formed on the surface of the silicon substrate 31 by conducting a selective thermal oxidation on the silicon substrate as shown in FIG. 5A. The thickness of the element separation insulating film 32 is set to about 500 nm. Thereafter, the silicon substrate 31 is subjected to the thermal oxidation to form the first gate insulating film 33 on the principal plane of the silicon substrate 31. The first gate insulating film 33 is formed of a silicon oxide film of 10 nm thickness. Subsequently, a polysilicon thin film 34 is deposited by the CVD (chemical vapor deposition) method. The thickness of the polysilicon thin film 34 is set to about 50 nm. Thereafter, phosphorus impurities are selectively doped into the polysilicon thin film 34 on the first gate insulating film 33 in the memory cell area. The concentration of the phosphorus impurities is set to $10^{19}$ to $10^{20}$ atm/cm$^3$. Furthermore, boron is doped at a concentration of $10^{15}$ to $10^{16}$ atm/cm$^3$ into the polysilicon thin film 34 which is formed on the element separation insulating film 32 by an ion implantation method.

Subsequently, a silicon dioxide film 35 is formed on the polysilicon thin film 34 at a thickness of 25 nm by the CVD method, and then subjected to a thermal treatment under a diluted oxygen atmosphere. Thereafter, a tungsten/polycide thin film 36 is deposited at a thickness of 200 nm.

Subsequently, the polysilicon thin film 34, the silicon dioxide thin film 35 and the tungsten/polycide thin film 36 are processed. This processing work is performed by a dry etching treatment using a well-known resist mask technique. With this processing, a floating gate 37, a second gate insulating film 38 and a control gate electrode 39 of the memory cell transistors are formed.

Figure 5C:
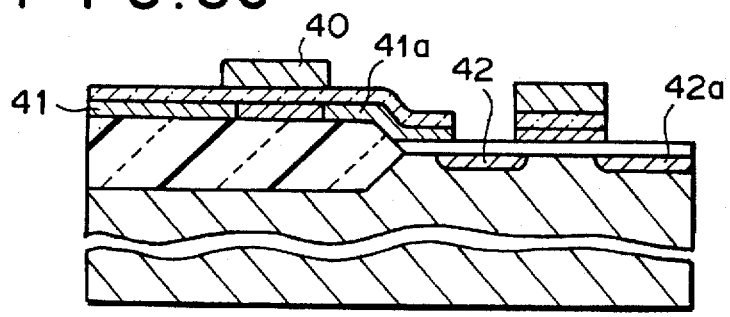

After the process as described above, the tungsten/polycide thin film 36 is further processed by the dry etching treatment to form a ST gate electrode 40 as shown in FIG. 5C, and then doped with arsenic by the ion implantation. The ion implantation energy is set to about 50 Kev, and the dose amount is set to about $5\times10^{13}$/cm$^2$. Thereafter, the thermal treatment is performed to form ST diffusion layers 41 and 41a and MT diffusion layers 42 and 42a. In this case, by additionally doping phosphorus at a dose amount of $1\times10^{15}$/cm$^2$ with the ion implantation method, and further performing the thermal treatment, the diffusion layers having high breakdown voltages can be obtained as shown in FIG. 5D.

In the foregoing description, the second gate insulating film 38 of the memory cell transistor and the gate insulating film of the selection transistor are formed of the silicon dioxide thin film 35. However, these gate insulating films may be formed of an SiON film or a thermally-nitrated SiO$_2$ film.

Figure 5D:
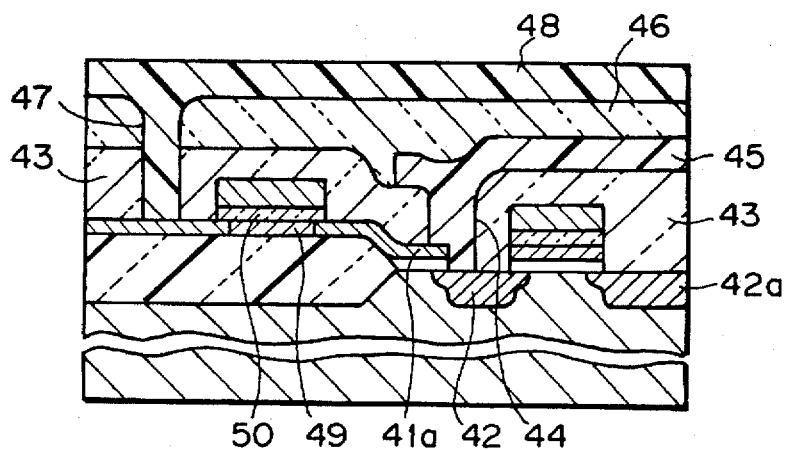

After the above process, a first layer insulating film 43 is formed as shown in FIG. 5D. The first layer insulating film 43 is formed of a composite film which comprises a silicon oxide film formed by the CVD method and SOG (spin on glass) formed by coating. Subsequently, a first contact hole 44 is formed to expose the ST diffusion layer 41a formed on the polysilicon thin film and the MCT diffusion layer 42. Thereafter, the tungsten thin film is formed by the CVD method and processed by the dry etching to form an auxiliary bit line 45. A second layer insulating film 46 is formed in the same manner of the formation of the first layer insulating film 43, and then a second contact hole 47 is formed in the first and second layer insulating films 43 and 46 to form a main bit line 48. The main bit line 48 is formed of aluminum metal. The channel region of the selection transistor is formed in the silicon thin film 49 which is composed of polysilicon as shown in FIG. 5D, and a ST gate insulating film 50 which is formed of the same material as the second gate insulating film 38 is formed on the channel region.

As described above, in the method of manufacturing the non-volatile semiconductor memory device of the present invention, the silicon thin film layer forming the selection transistor and the floating gate electrode layer of the memory cell transistor are formed of the same polysilicon thin film 34. Furthermore, the ST transistor gate insulating film 35 of the selection transistor and the second gate insulating film 38 of the memory cell transistor are formed in the same process. Still furthermore, the ST transistor gate electrode 40 and the tungsten/polycide thin film which is used as the control gate electrode 39 of the memory cell transistor are formed in the same process, too. As described above, the formation of the selection transistor and the formation of the memory transistor are performed substantially in the same film forming process and the same processing work. Therefore, there is no increase in the number of processes to manufacture the non-volatile semiconductor memory device according to the present invention.

In the manufacturing method as described above, the polysilicon thin film is used as the silicon thin film, however, in place of the polysilicon thin film, a mono-crystalline silicon thin film may be used as the silicon thin film.

As described above, according to the present invention, the floating gate type transistor is used to select the bit line for the memory cell which is a non-volatile memory element, and the selection transistor to which a high voltage is applied is formed on the semiconductor thin film such as a silicon thin film or the like. Therefore, the high densification and the high integration of the non-volatile semiconductor memory device containing these memory cells and selection transistors can be facilitated.

Furthermore, in the manufacturing method of the selection transistors and the memory cell transistors as described above, the film formation or processing for these transistors is performed in the same process, so that the non-volatile semiconductor memory device according to the present invention can be manufactured with no additive process.

While this invention has been particularly shown and described with reference to the preferred embodiment thereof, it will be understood that various changes in form and details may be made therein without departing from the spirit and scope of the invention.

What is claimed is:

1. A non-volatile semiconductor memory device, comprising:

a semiconductor substrate having a surface with a principal plane, said surface having an area on which an element separation insulating film is selectively formed and an area with said surface exposed for forming a memory cell;

a memory cell formed on the exposed surface of said principal plane, said memory cell comprises a floating gate type transistor having a floating gate electrode formed on a first gate insulating film on the principal plane of said semiconductor substrate and a control gate electrode formed on a second gate insulating film on the floating gate electrode; and a thin film transistor formed on said element separation insulating film, wherein said memory cell is connected to a first bit line, and the first bit line is connected to one of source and drain regions of said thin film transistor while the other of the source and drain regions is connected to a second bit line.

2. The non-volatile semiconductor memory device as claimed in claim 1, wherein a gate insulating film of said thin film transistor is constructed by said second gate insulating film.

3. The non-volatile semiconductor memory device as claimed in claim 1, wherein one of the source and drain regions of said thin film transistor and a diffusion layer of said memory cell are connected to each other and to said first bit line through a common contact hole.

4. The non-volatile semiconductor memory device as claimed in claim 1, wherein said first gate insulating film is formed on the principal plane of said semiconductor substrate on which said element separation insulating film is selectively provided, a silicon thin film is formed so as to cover said first gate insulating film, said second gate insulating film is formed on said silicon thin film, and then a metal thin film is formed so as to cover said second gate insulating film.

5. The non-volatile semiconductor memory device as claimed in claim 4, wherein the source and drain regions and a channel region of said thin film transistor and said floating gate electrode are formed in said silicon thin film, and the gate electrode of said thin film transistor and said control gate electrode of said memory cells are formed in said metal thin film.

6. The non-volatile semiconductor memory device as claimed in claim 1, wherein a silicon thin film is formed on said element separation insulating film, said thin film transistor is formed on said silicon thin film, and said floating gate region of said memory cell is formed simultaneously with formation of the source and drain regions of said thin film transistor.

7. The non-volatile semiconductor memory device as claimed in claim 1, wherein said thin film transistor is a selection transistor for selectively reading out data stored in said memory cells.

8. The non-volatile semiconductor memory device as claimed in claim 1, wherein said thin film transistor is a sector erasing transistor for selectively erasing data stored in said memory cells.

9. The non-volatile semiconductor memory device as claimed in claim 1, wherein said thin film transistor is formed of a polysilicon layer.

10. A non-volatile semiconductor memory device, comprising:
a semiconductor substrate having a surface with a principal plane;
a plurality of memory cells formed on said principal plane of said semiconductor substrate surface;
an element separation insulating film selectively formed on said surface of said semiconductor substrate adjacent to areas of said semiconductor substrate on which said memory cells are formed; and
a plurality of thin film transistors formed on said element separation insulating film adjacent to said memory cells, wherein a predetermined number of said memory cells is connected to a first bit line in parallel, and the first bit line is connected to one of source and drain regions of each of said thin film transistors and the other of said source and drain regions is connected to a second bit line.

11. The non-volatile semiconductor memory device as claimed in claim 10, wherein said plurality of thin film transistors are selectively separated from one another by a first insulating film formed over and between each of said plurality of thin film transistors, thereby preventing any parasitic MOS transistors from occurring between adjacent ones of said plurality of thin film transistors.

12. The non-volatile semiconductor memory device as claimed in claim 10, wherein one of the source and drain regions of at least one of said thin film transistors and a diffusion layer of at least one of said memory cells are connected to each other and to said first bit line through a common contact hole.

13. The non-volatile semiconductor memory device as claimed in claim 12, wherein each of said memory cells comprises a floating gate type transistor having a floating gate electrode formed on a first gate insulating film on the principal plane of said semiconductor substrate and a control gate electrode formed on a second gate insulating film on the floating gate electrode.

14. The non-volatile semiconductor memory device as claimed in claim 13, wherein said first gate insulating film is formed on the principal plane of said semiconductor substrate, a silicon thin film is formed so as to cover said first gate insulating film, said second gate insulating film is formed on said silicon thin film, and then a metal thin film is formed so as to cover said second gate insulating film.

15. The non-volatile semiconductor memory device as claimed in claim 14, wherein the source and drain regions and a channel region of said thin film transistors and said floating gate electrodes are formed in said silicon thin film, and the gate electrode of said thin film transistor and said control gate electrode of said memory cells are formed in said metal thin film.

16. The non-volatile semiconductor memory device as claimed in claim 15, wherein a silicon thin film is formed on said element separation insulating film, said thin film transistor is formed on said silicon thin film, and said floating gate region of said memory cells is formed simultaneously with formation of the source and drain regions of said thin film transistor.

17. A non-volatile semiconductor memory device, comprising:
a semiconductor substrate having a surface with a principal plane;
a plurality of memory cells formed on said principal plane of said semiconductor substrate surface;
an element separation insulating film selectively formed on said surface of said semiconductor substrate adjacent to areas of said semiconductor substrate on which said memory cells are formed; and
a plurality of thin film transistors formed on said element separation insulating film adjacent to said memory cells, wherein said thin film transistors are selection transistors for selectively reading out data stored in said memory cells.

18. A non-volatile semiconductor memory device, comprising:
a semiconductor substrate having a surface with a principal plane;
a plurality of memory cells formed on said principal plane of said semiconductor substrate surface;
an element separation insulating film selectively formed on said surface of said semiconductor substrate adjacent to areas of said semiconductor substrate on which said memory cells are formed; and
a plurality of thin film transistors formed on said element separation insulating film adjacent to said memory cells, wherein said thin film transistors are sector erasing transistors for selectively erasing data stored in said memory cells.

19. A method of making a non-volatile semiconductor memory device, comprising the steps of:
providing a semiconductor substrate having a surface with a principal plane;

forming a plurality of memory cells on said principal plane of said semiconductor substrate surface;

forming an element separation insulating film selectively on said surface of said semiconductor substrate adjacent to areas of said semiconductor substrate on which said memory cells are formed;

forming a plurality of thin film transistors on said element separation insulating film adjacent to said memory cells;

forming a first insulating film over and between each of said plurality of thin film transistors so that said plurality of thin film transistors are selectively separated and insulated from one another; and connecting one of the source and drain regions of at least one of said thin film transistors and a diffusion layer of at least one of said memory cells to each other, and to a bit line, through a common contact hole.

* * * * *